(12) United States Patent
Xu et al.

(10) Patent No.: US 12,527,189 B2
(45) Date of Patent: Jan. 13, 2026

(54) DISPLAY SUBSTRATE AND DISPLAY APPARATUS

(71) Applicants: Hefei BOE Joint Technology Co., Ltd., Hefei (CN); BOE Technology Group Co., Ltd., Beijing (CN)

(72) Inventors: Pan Xu, Beijing (CN); Zhidong Yuan, Beijing (CN)

(73) Assignees: Hefei BOE Joint Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 674 days.

(21) Appl. No.: 17/795,950

(22) PCT Filed: Sep. 28, 2021

(86) PCT No.: PCT/CN2021/121280
§ 371 (c)(1),
(2) Date: Jul. 28, 2022

(87) PCT Pub. No.: WO2023/050052
PCT Pub. Date: Apr. 6, 2023

(65) Prior Publication Data
US 2023/0157111 A1    May 18, 2023

(51) Int. Cl.
*H10K 59/131* (2023.01)
*G09G 3/3233* (2016.01)
*H10K 59/122* (2023.01)

(52) U.S. Cl.
CPC ....... *H10K 59/1315* (2023.02); *G09G 3/3233* (2013.01); *H10K 59/122* (2023.02);
(Continued)

(58) Field of Classification Search
CPC ............ H10K 59/1315; H10K 59/122; G09G 3/3233; G09G 2300/0426;
(Continued)

(56) References Cited

U.S. PATENT DOCUMENTS 7,474,047 B2    1/2009  Kim
8,836,213 B2    9/2014  Kim et al.
(Continued)

FOREIGN PATENT DOCUMENTS

CN    104900677 A    9/2015
CN    107170783 A    9/2017
(Continued)

*Primary Examiner* — Steven B Gauthier
(74) *Attorney, Agent, or Firm* — Westman, Champlin & Koehler, P.A.

(57) ABSTRACT

A display substrate is provided. The display substrate includes: a base substrate including a display area and a peripheral area located on at least a first side of the display area; a plurality of pixel units arranged in an array along a first direction and a second direction in the display area of the base substrate, where the pixel units include a pixel driver circuit and a light-emitting device electrically connected to the pixel driver circuit, and the light-emitting device includes a cathode, an anode, and a light-emitting layer disposed between the cathode and the anode; and a cathode line located in the peripheral area and electrically connected to the cathode. The cathode line substantially surrounds the display area and is electrically connected to the cathode line at a plurality of positions. The cathode line includes a first cathode sub-line located in the same layer as the anode.

20 Claims, 13 Drawing Sheets

(52) U.S. Cl.
CPC .............. *G09G 2300/0426* (2013.01); *G09G 2300/0819* (2013.01); *G09G 2300/0842* (2013.01)

(58) Field of Classification Search
CPC ... G09G 2300/0819; G09G 2300/0842; G09G 2300/0861
See application file for complete search history.

(56) References Cited

U.S. PATENT DOCUMENTS

| | | |
|---|---|---|
| 10,135,020 B1 | 11/2018 | Zhang et al. |
| 10,937,849 B2 | 3/2021 | Cheng |
| 2005/0258740 A1 | 11/2005 | Kim |
| 2011/0241563 A1 | 10/2011 | Kim et al. |
| 2020/0035773 A1* | 1/2020 | Cheng .................. H10K 59/126 |
| 2020/0258958 A1* | 8/2020 | Gai ...................... H10K 59/122 |
| 2021/0082343 A1* | 3/2021 | Lee ........................ H10K 59/40 |

FOREIGN PATENT DOCUMENTS

| | | | | |
|---|---|---|---|---|
| CN | 108470750 A | 8/2018 | | |
| CN | 109037282 A | 12/2018 | | |
| CN | 109037299 A | 12/2018 | | |
| CN | 109147820 A | 1/2019 | | |
| CN | 211150599 U | * | 7/2020 | ......... H01L 27/3279 |
| CN | 111524956 A | 8/2020 | | |
| CN | 111562704 A | 8/2020 | | |
| CN | 111785743 A | 10/2020 | | |
| CN | 112506367 A | 3/2021 | | |
| JP | 2005340202 A | 12/2005 | | |
| KR | 20110111747 A | 10/2011 | | |
| KR | 20150071840 A | 6/2015 | | |

\* cited by examiner

DISPLAY SUBSTRATE AND DISPLAY APPARATUS

CROSS-REFERENCE TO RELATED APPLICATION

This application is a Section 371 National Stage Application of International Application No. PCT/CN2021/121280, filed on Sep. 28, 2021, entitled "DISPLAY SUBSTRATE AND DISPLAY APPARATUS", the disclosure of which is incorporated herein by reference in its entirety.

TECHNICAL FIELD

The present disclosure relates to a field of display technology, and in particular, to a display substrate and a display apparatus.

BACKGROUND

An organic light-emitting diode (OLED) display apparatus is a self-emitting device without a backlight. The OLED display apparatus further provides more vivid colors and a larger color gamut than a conventional liquid crystal display (LCD) apparatus. Furthermore, the OLED display apparatus may be more flexible, thinner, and lighter than a typical LCD device. The OLED display apparatus generally includes an anode, an organic layer including an organic light-emitting layer, and a cathode. The OLED may be a bottom-emission OLED, or a top-emission OLED. In the bottom-emission OLED, light is extracted from an anode side. In the bottom-emission OLED, the anode is generally transparent and the cathode is generally reflective. In the top-emission OLED, light is extracted from a cathode side. In the top-emission OLED, the cathode is optically transparent and the anode is reflective. The top-emission OLED is more applicable for a high PPI display product, and more in line with the market development trend and the industry development trend. Therefore, the OLED display apparatus with the top-emission design has gradually become one of the hotspots for research and development personnel.

The above information disclosed in this section is only for an understanding of the background of the technical concept of the present disclosure, and thus the above information may contain information that is not part of the prior art.

SUMMARY

In an aspect, there is provided a display substrate, including:
  a base substrate including a display area and a peripheral area located on at least a first side of the display area;
  a plurality of pixel units arranged in an array along a first direction and a second direction in the display area of the base substrate, where the pixel unit includes a pixel driver circuit and a light-emitting device electrically connected to the pixel driver circuit, and the light-emitting device includes a cathode, an anode, and a light-emitting layer disposed between the cathode and the anode;
  an anode line located in the peripheral area and configured to supply an anode voltage; and
  a cathode line located in the peripheral area and electrically connected to the cathode,
  where the cathode line substantially surrounds the display area, and the cathode is electrically connected to the cathode line at a plurality of positions; and
  where the cathode line includes a first cathode sub-line located in a same layer as the anode, and an orthographic projection of the first cathode sub-line on the base substrate partially overlaps with an orthographic projection of the anode line on the base substrate.

According to some exemplary embodiments, the display substrate further includes a pixel defining layer on the base substrate, the pixel defining layer being between a layer where the anode is located and a layer where the cathode is located; the pixel defining layer includes a first via hole and a second via hole, each of the first via hole and the second via hole exposes at least a part of the first cathode sub-line, and the cathode is electrically connected to the first cathode sub-line through the first via hole and the second via hole.

According to some exemplary embodiments, the pixel driver circuit includes at least one thin film transistor and at least one capacitor that are disposed on the base substrate, the thin film transistor including an active layer, a gate, a source, and a drain; the display substrate includes: a first conductive layer disposed on a side of the active layer away from the base substrate, the gate being located in the first conductive layer; a second conductive layer disposed on a side of the first conductive layer away from the base substrate, the source and the drain being located in the second conductive layer; a third conductive layer disposed on a side of the second conductive layer away from the base substrate, the third conductive layer being located between the second conductive layer and a layer where the anode is located; and the cathode line includes a second cathode sub-line located in the second conductive layer.

According to some exemplary embodiments, the cathode line includes a third cathode sub-line located in the third conductive layer.

According to some exemplary embodiments, the display substrate includes a first insulating layer disposed between the second conductive layer and the third conductive layer, the first insulating layer includes a third via hole and a fourth via hole, and each of the third via hole and the fourth via hole exposes at least a part of the second cathode sub-line; and the third cathode sub-line is electrically connected to the second cathode sub-line through the third via hole and the fourth via hole.

According to some exemplary embodiments, the first via hole extends in the first direction, the pixel defining layer includes at least two second via holes, and the at least two second via holes are respectively located on two sides of the first via hole.

According to some exemplary embodiments, an extending direction of the fourth via hole is the same as a direction of the second cathode sub-line, and the fourth via hole is configured to expose a part of the second cathode sub-line occupying more than 50% of a perimeter of the second cathode sub-line; and/or, an extending direction of the second via hole is the same as the direction of the second cathode sub-line, and the second via hole is configured to expose a part of the first cathode sub-line occupying more than 50% of a perimeter of the first cathode sub-line.

According to some exemplary embodiments, the third via hole includes a first part and a second part, where the first part extends in the first direction and the second part extends in the second direction, the first direction and the second direction crossing.

According to some exemplary embodiments, an orthographic projection of the second via hole on the base substrate at least partially overlaps with an orthographic projection of the fourth via hole on the base substrate.

According to some exemplary embodiments, the anode line includes a first anode sub-line located in the first conductive layer.

According to some exemplary embodiments, the anode line includes a second sub anode line located in a second conductive layer, and the second sub anode line is electrically connected to the first sub anode line through a fifth via hole.

According to some exemplary embodiments, the anode line includes a third anode sub-line located in the third conductive layer, and the third anode sub-line is electrically connected to the second anode sub-line through a sixth via hole.

According to some exemplary embodiments, the first anode sub-line includes a first part and a second part, where the first part of the first anode sub-line extends in the first direction, and the second part of the first anode sub-line extends in the second direction; and an orthographic projection of the fifth via hole on the base substrate at least partially overlaps with an orthographic projection of the second part of the first anode sub-line on the base substrate.

According to some exemplary embodiments, an orthographic projection of the first part of the first anode sub-line on the base substrate at least partially overlaps with the orthographic projection of the first cathode sub-line on the base substrate.

According to some exemplary embodiments, an orthographic projection of the first part of the first anode sub-line on the base substrate at least partially overlaps with an orthographic projection of the first via hole on the base substrate.

According to some exemplary embodiments, the display substrate further includes an initialization signal line located in the peripheral area, the initialization signal line being configured to supply an initialization voltage; the initialization signal line includes a first initialization signal sub-line and a second initialization signal sub-line, where the first initialization signal sub-line is located in the second conductive layer and the second initialization signal sub-line is located in the third conductive layer; and the first initialization signal sub-line is electrically connected to the second initialization signal sub-line through a seventh via hole.

According to some exemplary embodiments, the seventh via hole and a sixth via hole extend in parallel in the first direction, and the seventh via hole and the sixth via hole are spaced apart in the second direction.

According to some exemplary embodiments, an orthographic projection of the initialization signal line on the base substrate is between an orthographic projection of a second sub cathode line on the base substrate and an orthographic projection of the anode line on the base substrate.

According to some exemplary embodiments, an orthographic projection of the first anode sub-line on the base substrate partially overlaps with an orthographic projection of the first via hole on the base substrate.

According to some exemplary embodiments, a ratio of a size of a part of the first via hole overlapping with the second part of the first anode sub-line in the first direction to a size of the second part of the first anode sub-line in the first direction is in a range of 0.8 to 1.2; and/or, a ratio of a size of a part of the first via hole overlapping with the first part of the first anode sub-line in the first direction to a size of the first part of the first anode sub-line in the first direction is in a range of 0.8 to 1.2; and/or, a ratio of a size of the part of the first via hole overlapping with the first part of the first anode sub-line in the second direction to a size of the first part of the first anode sub-line in the second direction is in a range of 0.4 to 0.8; and/or, a ratio of a size of the second via hole in the second direction to a size of the first via hole in the second direction is in a range of 1.1 to 10.

According to some exemplary embodiments, the display substrate includes a second insulating layer disposed between the third conductive layer and the layer where the anode is located, where the second insulating layer includes an eighth via hole, and the eighth via hole exposes at least a part of the third cathode sub-line; and the first cathode sub-line is electrically connected to the third cathode sub-line through the eighth via hole.

According to some exemplary embodiments, an orthographic projection of the eighth via hole on the base substrate at least partially overlaps an orthographic projection of the fourth via hole on the base substrate.

In another aspect, there is provided a display apparatus, including the display substrate described above.

BRIEF DESCRIPTION OF THE DRAWINGS

The features and advantages of the present disclosure will become more apparent by describing exemplary embodiments of the present disclosure with reference to the accompanying drawings in detail.

DETAILED DESCRIPTION OF EMBODIMENTS

Figure 1:
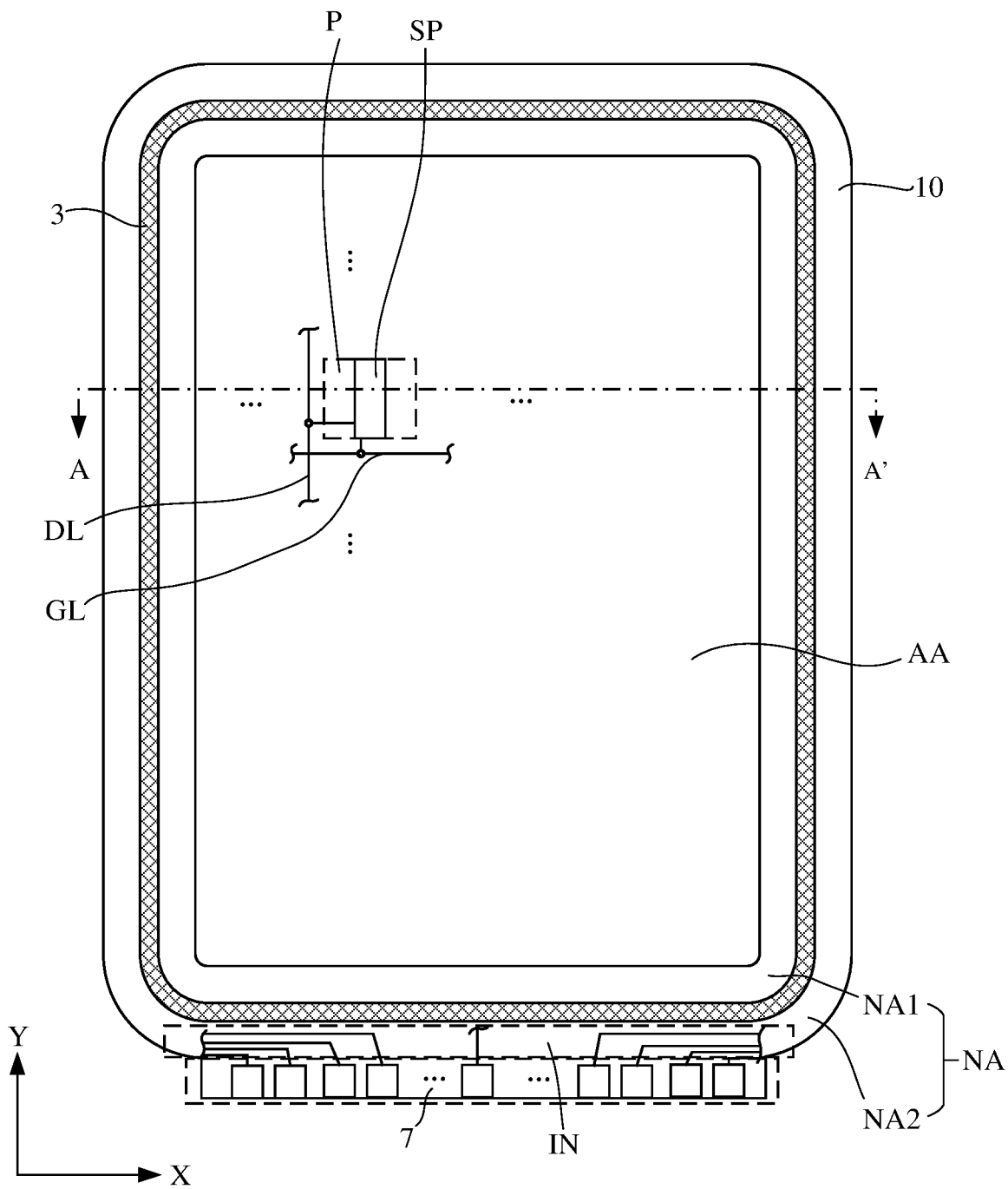
FIG. 1 shows a plan view of an OLED display panel according to some exemplary embodiments of the present disclosure.

In order to make objectives, technical solutions, and advantages of the embodiments of the present disclosure clearer, the technical solutions in the embodiments of the present disclosure will be described clearly and completely with reference to the accompanying drawings. Obviously, the embodiments described are only some, but not all, of the embodiments of the present disclosure. Based on the described embodiments of the present disclosure, all other embodiments obtained by those of ordinary skill in the art without creative work fall within the protection scope of the present disclosure.

It will be noted that in the accompanying drawings, sizes and relative sizes of elements may be exaggerated for purposes of clarity and/or description. As such, sizes and relative sizes of respective elements are not necessarily limited to those shown in the figures. In the description and the drawings, the same or similar reference numerals refer to the same or similar parts.

When an element is described as being "on", "connected to" or "coupled to" another element, the element may be directly on, connected or coupled to the another element, or an intervening element may be present. However, when an element is described as being "directly on", "directly connected to" or "directly coupled to" another element, there is no intervening element. Other terms and/or expressions used to describe a relationship between elements should be interpreted in a similar manner, such as, "between . . . and" versus "directly between . . . and", "adjacent" versus "directly adjacent" or "on" versus "directly on", etc. In addition, the term "connection" may refer to a physical connection, an electrical connection, a communication connection, and/or a fluid connection. In addition, X, Y, and Z axes are not limited to the three axes of a rectangular coordinate system, and may be interpreted in a broader sense. For example, X, Y, and Z axes may be perpendicular to each other, or may represent different directions that are not perpendicular to each other. For purposes of the present disclosure, "at least one of X, Y and Z" and "at least one selected from a group consisting of X, Y and Z" may be interpreted as X only, Y only, Z only, or any combination of two or more of X, Y and Z, such as XYZ, XYY, YZ and ZZ. As used herein, the term "and/or" includes any and all combinations of one or more of related items listed.

It will be noted that, although terms "first", "second", etc. may be used herein to describe various parts, components, elements, regions, layers and/or sections, these parts, components, elements, regions, layers and/or sections should not be limited by these terms. Rather, these terms are used to distinguish one part, component, element, region, layer or section from another. Thus, for example, a first part, a first component, a first element, a first region, a first layer, and/or a first section discussed below may be termed a second part, a second component, a second element, a second region, a second layer, and/or a second section without departing from teachings of the present disclosure.

For ease of description, spatial relationship terms, such as "above", "below", "left", "right" and the like, may be used herein to describe a relationship between one element or feature and another element or feature as illustrated in the figures. It will be understood that the spatial relationship terms are intended to encompass different orientations of a device in use or operation in addition to an orientation depicted in the figures. For example, if the device in the figures is turned over, elements described as "below" or "beneath" other elements or features would then be oriented "above" or "over" other elements or features Those skilled in the art will understand that, unless otherwise stated, the expression "height" or "thickness" refers to a dimension of a surface of each film layer arranged along a direction perpendicular to a display substrate, i.e., a dimension along a light-exiting direction of the display substrate, or is referred to as a dimension along a normal direction of the display apparatus, or is referred to as a dimension along a Z-direction in the drawings.

Herein, unless otherwise stated, the expression "patterning process" generally includes steps of photoresist coating, exposure, development, etching, photoresist stripping, and the like. The expression "a patterning process" means a process of forming a patterned layer, member, component, or the like using a mask.

It will be noted that the expression "a same layer", "arranged in a same layer" or a similar expression refers to a layer structure formed by forming a film for forming a specific pattern by a same film formation process and patterning the film by a patterning process using a same mask. Depending on different specific patterns, a patterning process may include a plurality of exposure, development or etching processes, and the specific patterns in a formed layer structure may be continuous or discontinuous. The specific pattern may also be at different heights or have different thicknesses.

Herein, unless otherwise stated, the expression "electrically connected" may mean that two parts or elements are directly electrically connected, for example, a part or element A is in direct contact with a part or element B, and an electrical signal may be transmitted between the two; the expression may also mean that two parts or elements are electrically connected through a conductive medium such as a conductive line, for example, a part or element A is electrically connected to a part or element B through a conductive line, so that an electrical signal may be transmitted between the two parts or elements; the expression may also mean that two parts or elements are electrically connected through at least one electronic component, for example, a part or element A is electrically connected to a part or element B through at least one thin film transistor, so that an electrical signal may be transmitted between the two parts or elements.

Herein, unless otherwise stated, the expression "via hole" may refer to a connection structure that penetrates an insulating layer between two conductive layers to electrically connect components located in the two conductive layers, in the form including, but not limited to, a via hole, a groove, a hollow part, etc.

Herein, unless otherwise stated, the expression "same" or "equal" means substantially the same or substantially equal under actual manufacturing process conditions, and is not intended to be limited to the exact same or strictly equal in the mathematical sense.

An embodiment of the present disclosure provides at least a display substrate and a display apparatus. The display substrate includes: a base substrate including a display area and a peripheral area located on at least a first side of the display area; a plurality of pixel units arranged in an array along a first direction and a second direction in the display area of the base substrate. The pixel unit includes: a pixel driver circuit and a light-emitting device electrically connected to the pixel driver circuit, where the light-emitting device includes a cathode, an anode, and a light-emitting layer disposed between the cathode and the anode; an anode line located in the peripheral area and configured to supply an anode voltage; and a cathode line located in the peripheral area and electrically connected to the cathode, where the cathode line substantially surrounds the display area, and the cathode is electrically connected to the cathode line at a plurality of positions. The cathode line includes a first cathode sub-line, the first cathode sub-line and the anode are located in a same layer. In the display substrate according to the embodiments of the present disclosure, an equivalent resistance of a connection between the cathode line and the cathode may be reduced, thereby reducing a magnitude of the drop in a cathode voltage at a position far away from a signal source.

Figure 2:
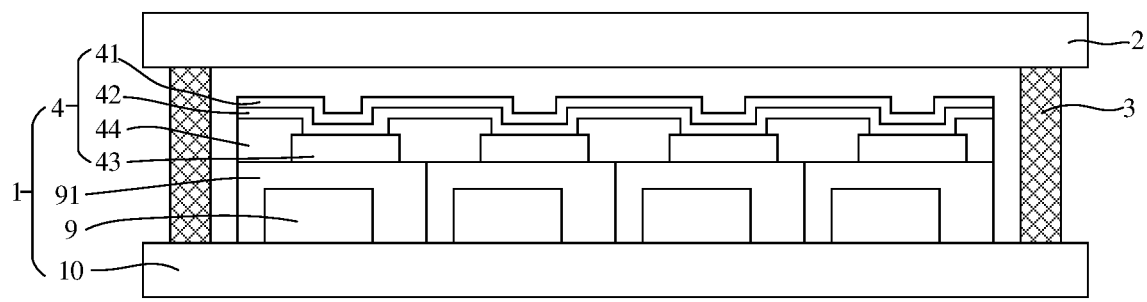
FIG. 2 shows a section of an OLED display panel taken along line AA' of FIG. 1 according to some exemplary embodiments of the present disclosure.

FIG. 1 shows a plan view of an OLED display panel according to some exemplary embodiments of the present disclosure. FIG. 2 shows a section of an OLED display panel taken along line AA' of FIG. 1 according to some exemplary embodiments of the present disclosure. Referring to FIG. 1 and FIG. 2, the OLED display panel may include a first substrate 1 and a second substrate 2 that are disposed to be face to face. For example, the first substrate 1 may be an array substrate, and the second substrate 2 may be a cover plate made of glass or the like.

For example, the OLED display panel may further include a sealant 3 disposed between the first substrate 1 and the second substrate 2, and the sealant 3 with an annular shape is disposed in a peripheral area of the first substrate 1, that is, a ring of sealant 3 is disposed in the peripheral area of the first substrate 1. In this way, the sealant 3 may prevent an intrusion of water vapor and oxygen, maintain a cell gap in the peripheral area of the display panel, and bond the first substrate and the second substrate. For example, a gap between the first substrate and the second substrate may also be filled with a filler, and the filler may be made of a resin material. An encapsulation structure of Dam plus Filler may be realized by providing the filler and the sealant 3. It will be noted that the embodiments of the present disclosure are not limited to the above encapsulation structure, and other types of encapsulation structures may be used in the embodiments of the present disclosure without collision.

Referring to FIG. 1, the first substrate 1 (i.e., the display substrate according to the embodiments of the present disclosure) includes a base substrate 10, for example, the base substrate 10 may be made of a material such as glass, plastic, polyimide, or the like. The base substrate 10 includes a display area AA and a peripheral area (or referred to as a peripheral area NA area) NA located on at least one side (for ease of description, this side is referred to as a first side) of the display area AA. The peripheral area NA may include a first peripheral area NA1 on a side of the sealant 3 proximate to the display area AA, and a second peripheral area NA2 on a side of the sealant 3 away from the display area AA.

With continued reference to FIG. 1, the first substrate 1 may include a plurality of pixel units P (schematically shown in a dotted box in FIG. 1) disposed in the display area AA, and the plurality of pixel units P may be arranged in an array along a first direction X and a second direction Y on the base substrate 10. Each pixel unit P may further include a plurality of sub-pixels, such as a red sub-pixel, a green sub-pixel, and a blue sub-pixel. A sub-pixel SP is schematically shown In FIG. 1.

For example, the display panel includes a signal input side IN (a lower side shown in FIG. 1). An external driver circuit 7 such as a COF may be connected to the signal input side IN, and the external driver circuit 7 may be electrically connected to the pixel units P in the display area through a plurality of signal lines. In this way, signals such as a first voltage signal, a second voltage signal, an initialization voltage signal, and a data signal may be transmitted to the plurality of pixel units P from the signal input side IN.

For example, the first side described above may be the signal input side IN. That is, the peripheral area NA is located on at least the signal input side IN of the display area AA. Optionally, as shown in FIG. 1, the peripheral area NA may be located on four sides of the display area AA. That is, the peripheral area NA may surround the display area AA.

It will be noted that, in the drawings, a pixel unit and a sub-pixel are schematically shown by rectangles, but this does not limit shapes of the pixel units and the sub-pixels included in the display panel provided in the embodiments of the present disclosure.

Figure 3:
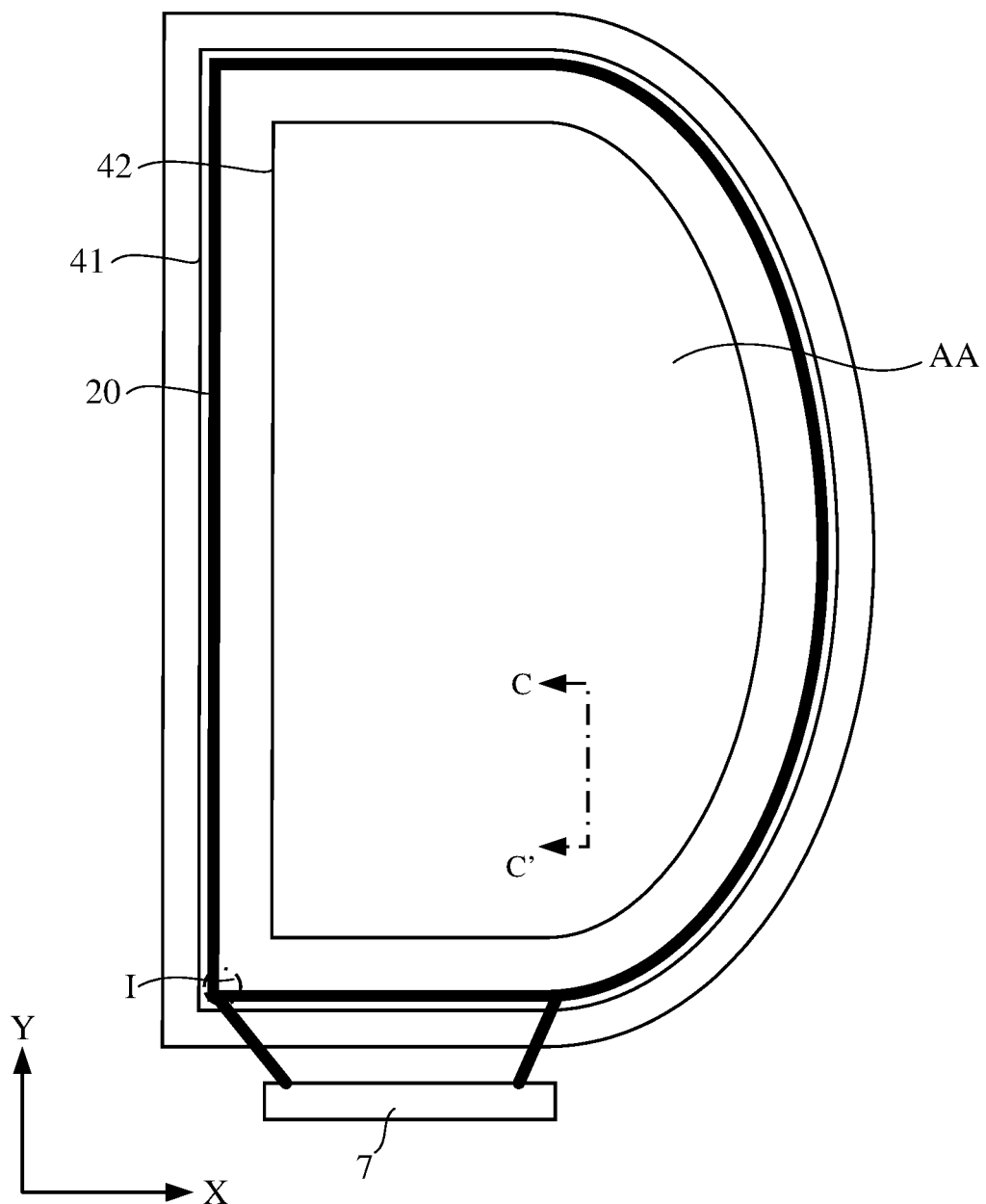
FIG. 3 shows a schematic plan view of a display substrate according to some exemplary embodiments of the present disclosure.

For example, FIG. 3 shows a schematic plan view of a display substrate according to some exemplary embodiments of the present disclosure. In this embodiment, the display substrate may be a D-type display substrate. However, the display substrate may be other special-shaped display substrates. Generally, in a special-shaped display substrate, an external driver circuit such as a COF is only provided on a side of the display substrate. As shown in FIG. 3, the external driver circuit 7 such as a COF is provided on a lower side of the display substrate.

The substrate 1 may include a light-emitting device, such as an OLED device 4. As shown in FIG. 2, the OLED device 4 includes a cathode 41, an anode 43 disposed opposite to the cathode 41, and a light-emitting layer 42 disposed between the cathode 41 and the anode 43.

One of the cathode 41 and the anode 43 is an anode, and the other is a cathode. For example, the cathode 41 may be a transparent cathode, for example, it may be made of a transparent conductive material which may include indium tin oxide (ITO), indium zinc oxide (IZO), or the like. The anode 43 may be a reflective anode, for example, it may be made of a metal material which may include an alloy such as magnesium aluminum alloy (MgAl) or lithium aluminum alloy (LiAl), or a single metal such as magnesium, aluminum, or lithium. The light-emitting layer 42 may have a multilayer structure, for example, it may include a multilayer structure formed by a hole injection layer, a hole transport layer, an organic light emitting layer, an electron transport layer, and an electron injection layer.

It will be noted that, the OLED device 4 may be driven either actively or passively. A passive matrix OLED array substrate includes a cathode and an anode, a part at an intersection of the anode and the cathode may emit light, and a driver circuit may be externally mounted by a connection method such as a tape carrier package or a glass carrier chip. In an active-matrix OLED array substrate, each pixel may be provided with a pixel driver circuit, and the pixel driver circuit may include a thin film transistor with a switching function (i.e., a switching transistor), a thin film transistor with a driving function (i.e., a driver transistor), and a charge storage capacitor. In addition, the pixel driver circuit may further include other types of thin film transistors with a compensation function. It will be understood that, in the embodiments of the present disclosure, the display panel may be provided with various types of known pixel driver circuits, which will not be repeated here.

Figure 13:
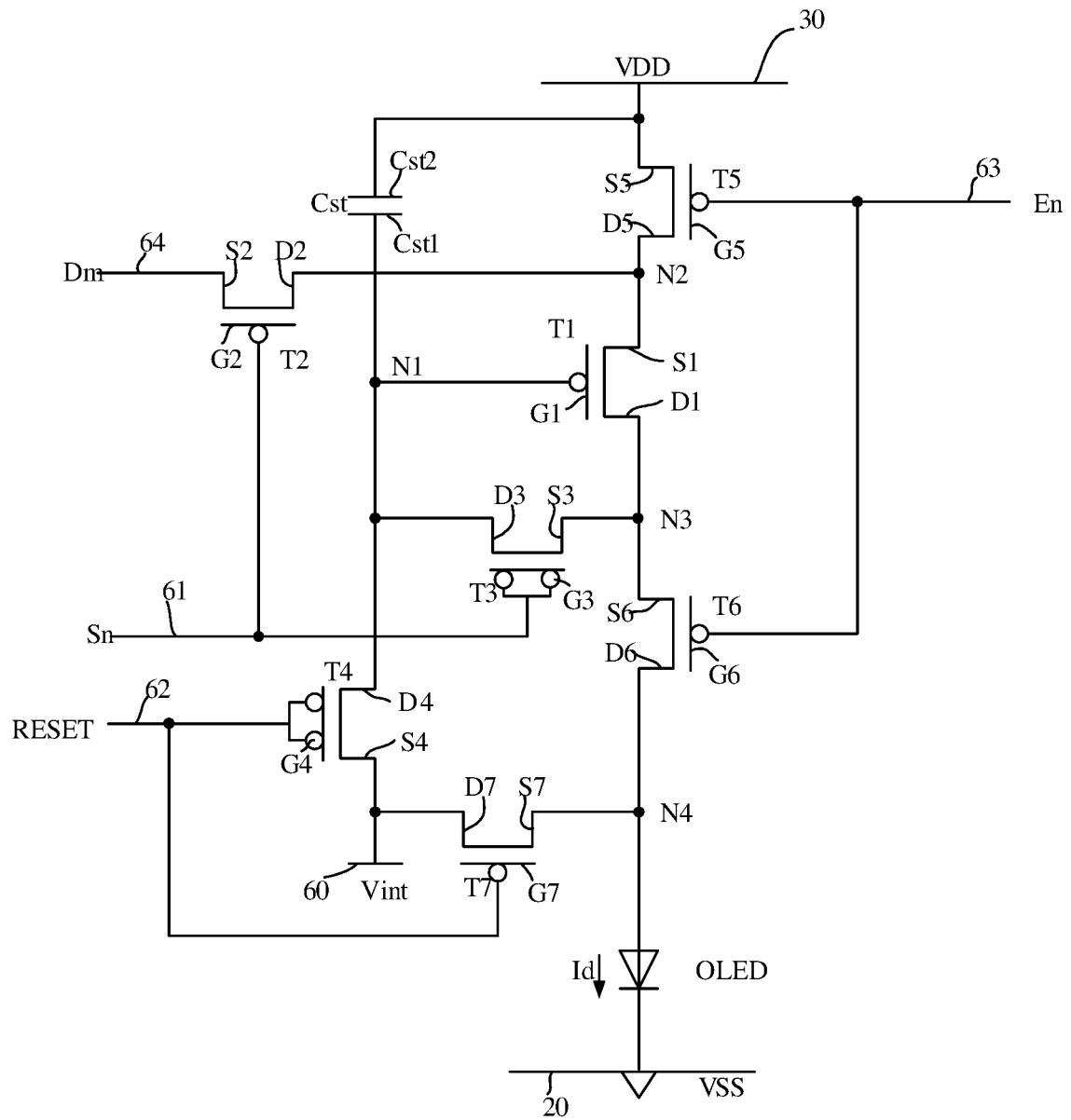
FIG. 13 shows an equivalent circuit diagram of a pixel driver circuit of a display substrate according to some exemplary embodiments of the present disclosure.

FIG. 13 shows an equivalent circuit diagram of a pixel driver circuit of a display substrate according to some exemplary embodiments of the present disclosure.

A structure of the pixel driver circuit is described below in detail by taking a 7T1C pixel driver circuit as an example. However, the embodiments of the present disclosure are not limited to the 7T1C pixel driver circuit, and other known driver circuit structures may be applied to the embodiments of the present disclosure without collision.

As shown in FIG. 13, the pixel driver circuit may include: a plurality of thin film transistors and a storage capacitor Cst. The pixel driver circuit is configured to drive an organic light-emitting diode (i.e., an OLED). The plurality of thin film transistors include a first transistor T1, a second transistor T2, a third transistor T3, a fourth transistor T4, a fifth transistor T5, a sixth transistor T6, and a seventh transistor T7. Each transistor includes a gate, a source, and a drain.

The display substrate may further include a plurality of signal lines, for example, the plurality of signal lines include: a scan signal line 61 for transmitting a scan signal Sn, a reset signal line 62 for transmitting a reset control signal RESET (i.e., a scan signal of a previous row), a light-emitting control line 63 for transmitting a light-emitting control signal En, a data line 64 for transmitting a data signal Dm, an anode line 30 for transmitting a driving voltage VDD, an initialization signal line 60 for transmitting an initialization voltage Vint, and a cathode line 20 for transmitting a VSS voltage.

A gate G1 of the first transistor T1 is electrically connected to a terminal Cst1 of the storage capacitor Cst, a source S1 of the first transistor T1 is electrically connected to the anode line 30 via the fifth transistor T5, and a drain D1 of the first transistor T1 is electrically connected to an anode of the OLED via the sixth transistor T6. The first transistor T1 receives the data signal Dm in response to a switching operation of the second transistor T2 to supply a driving current Id to the OLED.

A gate G2 of the second transistor T2 is electrically connected to the scan signal line 61, a source S2 of the second transistor T2 is electrically connected to the data line 64, and a drain D2 of the second transistor T2 is electrically connected to the anode line 30 via the fifth transistor T5 and is electrically connected to the source S1 of the first transistor T1. The second transistor T2 is turned on in response to the scan signal Sn transmitted through the scan signal line 61 to perform a switching operation, so as to transmit the data signal Dm transmitted to the data line 64 to the source S1 of the first transistor T1.

A gate G3 of the third transistor T3 is electrically connected to the scan signal line 61, a source S3 of the third transistor T3 is electrically connected to the anode of the OLED via the sixth transistor T6, and is electrically connected to the drain D1 of the first transistor T1. A drain D3 of the third transistor T3 is electrically connected to the terminal (i.e., a first capacitor electrode) Cst1 of the storage capacitor Cst, a drain D4 of the fourth transistor T4, and the gate G1 of the first transistor T1. The third transistor T3 is turned on a in response to the scan signal Sn transmitted through the scan signal line 61, so as to connect the gate G1 and the drain D1 of the first transistor T1 to each other, thereby performing a diode connection of the first transistor T1.

A gate G4 of the fourth transistor T4 is electrically connected to the reset control signal line 62, and a source S4 of the fourth transistor T4 is electrically connected to the initialization signal line 60. And the drain D4 of the fourth transistor T4 is electrically connected to the terminal Cst1 of the storage capacitor Cst, the drain D3 of the third transistor T3, and the gate G1 of the first transistor T1. The fourth transistor T4 is turned on in response to the reset control signal Sn-1 transmitted through the reset control signal line 62, so as to transmit the initialization voltage Vint to the gate G1 of the first transistor T1, thereby performing an initialization operation to initialize a voltage of the gate G1 of the first transistor T1.

A gate G5 of the fifth transistor T5 is electrically connected to the light-emitting control line 63, and a source S5 of the fifth transistor T5 is electrically connected to the anode line 30. A drain D5 of the fifth transistor T5 is electrically connected to the source S1 of the first transistor T1 and the drain D2 of the second transistor T2.

A gate G6 of the sixth transistor T6 is electrically connected to the light-emitting control line 63, a source S6 of the sixth transistor T6 is electrically connected to the drain D1 of the first transistor T1 and is electrically connected to the source S3 of the third transistor T3. A drain D6 of the sixth transistor T6 is electrically connected to the anode of the OLED. The fifth transistor T5 and the sixth transistor T6 are concurrently (e.g., simultaneously) turned on in response to the light-emitting control signal En transmitted through the light-emitting control line 63, so as to transmit a driving voltage ELVDD to the OLED, thereby allowing the driving current Id to flow into the OLED.

The seventh transistor T7 includes: a gate G7 connected to the reset control signal line 62; a source S7 connected to the drain D6 of the sixth transistor T6 and the anode of the OLED; and a drain D7 connected to the initial initialization signal line 60. The seventh transistor T7 transmits the reset control signal Sn-1 from the reset control signal line 62 to the gate G7.

Another terminal Cst2 of the storage capacitor Cst is electrically connected to the anode line 30, and a cathode of the OLED is electrically connected to the cathode line 20 to receive a common voltage ELVSS. Accordingly, the OLED receives the driving current Id from the first transistor T1 to emit light, thereby displaying an image.

It will be noted that, in FIG. 25, each of the thin film transistors T1, T2, T3, T4, T5, T6, and T7 is a p-channel field effect transistor. However, the embodiments of the present disclosure are not limited to this, at least some of the thin film transistors T1, T2, T3, T4, T5, T6, and T7 may be n-channel field effect transistors.

During an initialization stage of the operation, the reset control signal Sn-1 at a low level is supplied through the reset control signal line 62. Subsequently, the initialization thin film transistor T4 is turned on in response to the low level of the reset control signal Sn-1, and the initialization voltage Vint from the initialization signal line 60 is transmitted to the gate G1 of the driver thin film transistor T1 through the initialization thin film transistor T4. Therefore, the driver thin film transistor T1 is initialized due to the initialization voltage Vint.

During a data programming stage, the scan signal Sn at a low level is supplied through the scan signal line 61. Subsequently, the switching thin film transistor T2 and the compensation thin film transistor T3 are turned on in response to the low level of the scan signal Sn. Accordingly, the driver thin film transistor T1 is in a diode-connection state through the turned-on compensation thin film transistor T3, and is biased in a forward direction.

Subsequently, a compensation voltage (Dm+Vth) (e.g., Vth is of a negative value) obtained by subtracting a threshold voltage Vth of the driver thin film transistor T1 from the data signal Dm supplied through the data line 64 is applied to the gate G1 of the driver thin film transistor T1. Subsequently, the driving voltage ELVDD and the compensation voltage (Dm+Vth) are applied to the two terminals of the storage capacitor Cst, such that charges corresponding to a voltage difference between the two terminals are stored in the storage capacitor Cst.

During a light-emitting stage, the light-emitting control signal En from the light-emitting control line 63 changes from being at a high level to being at a low level. Subsequently, during the light-emitting stage, the first light-emitting control thin film transistor T5 and the second light-emitting control thin film transistor T6 are turned on in response to the low level of the light-emitting control signal En.

Subsequently, a driving current is generated based on a difference between the voltage of the gate G1 of the driver thin film transistor T1 and the driving voltage ELVDD. The driving current Id corresponding to a difference between a driving current and a bypass current is supplied to the OLED through the second light-emitting control thin film transistor T6.

During the light-emitting stage, based on a current-voltage relationship of the driver thin film transistor T1, a gate-source voltage of the driver thin film transistor T1 is maintained at ((Dm+Vth)−ELVDD) due to the presence of capacitor Cst. The driving current Id is proportional to $(Dm-ELVDD)^2$. Therefore, the driving current Id may not be affected by the fluctuation of the threshold voltage Vth of the driver thin film transistor T1.

For example, as shown in FIG. 2, the first substrate 1 includes a driver circuit layer 9, and the pixel driver circuit described above may be provided in the driver circuit layer 9. An insulating layer 91 may be provided between the driver circuit layer 9 and the OLED device 4, and the insulating layer 91 may be a single insulating film layer or a stacked layer composed of a plurality of insulating film layers.

The first substrate 1 may further include various signal lines disposed on the base substrate 10, and the various signal lines may include a scan line, a data line, a ELVDD power line, a ELVSS power line, etc., so as to provide a pixel driver circuit in each sub-pixel with various signals such as a control signal, a data signal, and a power supply voltage. In the embodiment shown in FIG. 1, a scan line GL and a data line DL are schematically shown. The scan line GL and the data line DL may be electrically connected to respective sub-pixels. For example, the scan line GL may include the scan signal line 61 for transmitting the scan signal Sn, the reset signal line 62 for transmitting the reset control signal RESET (i.e., the scan signal of the previous row), etc. shown in FIG. 13, and the data line DL may include the data line 64 for transmitting the data signal Dm shown in FIG. 13.

Referring to FIG. 3, the first substrate 1 may include a cathode line 20, a light-emitting layer 42, and a cathode 41 located on the base substrate 10. The cathode line 20 is located in the peripheral area NA, and the cathode line 20 substantially surrounds the display area AA. The light-emitting layer 42 covers at least the display area AA. For example, the light-emitting layer 42 may cover the whole display area AA and a part of the peripheral area NA. The cathode 41 covers the display area AA and a part of the peripheral area NA, that is, the cathode 41 is implemented as a continuous sheet. The cathode 41 covers the display area AA to serve as cathodes of respective light-emitting devices in the display area AA, so that the display function may be realized. In addition, the cathode 41 also covers a part of the peripheral area NA. In this part of the peripheral area NA, the cathode 41 overlaps with the cathode line 20 so as to be electrically connected with the cathode line 20, so that a cathode voltage provided by the cathode line 20 may be obtained.

It will be noted that the expression "the cathode line substantially surrounds the display area" means that more than 80% (or even more than 90%) of a perimeter of the display area is surrounded by the cathode line.

For example, the light-emitting layer 42 exposes an edge part of the cathode 41 located in the peripheral area NA. In addition, an insulating layer is provided between the layer where the cathode line 20 is located and the layer where the cathode 41 is located. The insulating layer includes a plurality of via holes, and the plurality of via holes also expose the edge part of the cathode 41 located in the peripheral area NA. In this way, the cathode 41 and the cathode line 20 may be electrically connected.

In the embodiments of the present disclosure, the cathode line 20 substantially surrounds the display area AA, and the cathode 41 is electrically connected to the cathode line 20 at a plurality of positions. That is, the cathode line 20 is wired to have an annular shape, and the cathode 41 is electrically connected to the cathode line 20 at a plurality of positions or at a plurality of regions in a periphery surrounding the display area AA. For example, a sum of lengths of the plurality of positions or regions occupying more than 50%, 70%, or 90% of the perimeter of the cathode line 20 surrounding the display area AA by one round. The cathode 41 is electrically connected to the cathode line 20 in most of the periphery surrounding the display area AA. In this way, an area of the contact between the cathode line 20 and the cathode 41 is increased, an equivalent resistance of a connection between the cathode line 20 and the cathode 41 is reduced, thereby reducing a drop magnitude of a cathode voltage at a position far away from a signal source (for example, an external driver circuit such as a COF). As a result, when the cathode signal is input to the cathode 41 through the cathode line 20, a voltage drop on the cathode 41 due to the resistance is reduced, so that a display uniformity of the display panel is improved.

In the embodiments of the present disclosure, the cathode line 20 is configured to input the cathode signal to the cathode 41, and the cathode line 20 is led out from a lower side of the display area AA, that is, the cathode line 20 is arranged around upper, left, and right regions of the display area AA, the cathode line 20 which is led from the lower side of the display area AA is configured to be electrically connected with the signal source. In the embodiments of the present disclosure, the provided arrangement of the cathode line 20 may increase the area of the contact between the cathode line 20 and the cathode 41, where the cathode line 20 is not only in contact with the cathode 41 in the lower side region of the display area AA, but also in contact with the cathode 41 in the upper, left, and right regions of the display area AA, thereby increasing the area of the contact between the cathode line 20 and the cathode 41 and reducing the equivalent resistance of the connection between the cathode line 20 and the cathode 41.

It will be noted that the light-emitting layer 42 may be formed by vapor deposition or inkjet printing. When formed by vapor deposition, the light-emitting layer 42 may be formed by preforming vapor deposition over the entire surface. For example, the vapor deposition region may be a rectangular region as shown in FIG. 1 or a special-shaped region as shown in FIG. 3, such that the light-emitting layer 42 may cover the whole display area AA and a part of the peripheral area NA. The light-emitting layer 42 has a continuous sheet structure, and thus an overlapping part of the cathode line 20 with the light-emitting layer 42 may fail to be bonded with the cathode 41, while a non-overlapping part of the cathode line 20 with the light-emitting layer 42 may be bonded with the cathode 41. For example, after all the films and layers of the display substrate are manufactured, redundant parts of light-emitting layer 42 and the cathode 41 beyond the peripheral area NA may be cut off, so as to form the special-shaped display substrate as shown in FIG. 3. When formed by inkjet printing, the light-emitting layer 42 is discontinuous, and the number of electrical connections between the cathode line 2 and the cathode 41 may be selected as much as possible according to the actual process.

Figure 4:
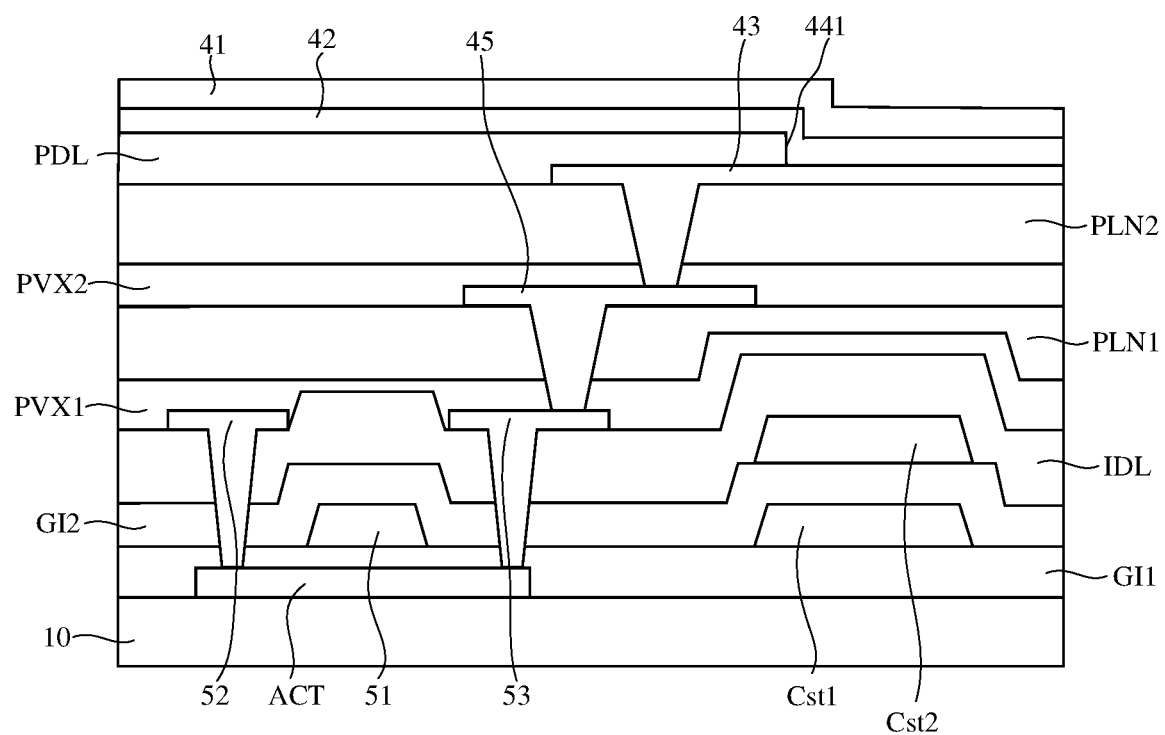
FIG. 4 shows a section of a display substrate taken along line CC' of FIG. 3 according to some exemplary embodiments of the present disclosure.

FIG. 4 shows a section of a display substrate taken along line CC' in FIG. 3 according to some exemplary embodiments of the present disclosure. For example, the pixel driver circuit may include a transistor and a capacitor. The transistor may include an active layer, a gate, a source, and a drain. The capacitor may include a first electrode pad and a second electrode pad.

Referring to FIG. 1 to FIG. 4, the first substrate 1 may include: an active layer ACT disposed on the base substrate 10, a gate insulating layer GI1 disposed on a side of the active layer ACT away from the base substrate 10, a gate 51 disposed on a side of the gate insulating layer GI1 away from the base substrate 10, an interlayer insulating layer IDL disposed on a side of the gate 51 away from the base substrate 10, a source 52 and a drain 53 disposed on a side of the interlayer insulating layer IDL away from the base substrate 10, a passivation layer PVX1 covering the source 52 and the drain 53. The source 52 and the drain 53 are respectively electrically connected to the active layer ACT through via holes.

As shown in FIG. 4, the first substrate 1 may further include: a first electrode pad Cst1 of the capacitor and a second electrode pad Cst2 of the capacitor. For example, the first electrode pad Cst1 and the second electrode pad Cst2 of the capacitor may be disposed opposite to each other, and an insulating layer may be disposed between the first electrode pad Cst1 of the capacitor and the second electrode pad Cst2 of the capacitor. The insulating layer may be the gate insulating layer GI2 shown in FIG. 4.

The first substrate 1 may further include: a planarization layer PLN1 disposed on a side of the passivation layer PVX1 away from the base substrate 10; a transition part 45 disposed on a side of the planarization layer PLN1 away from the base substrate 10; a passivation layer PVX2 disposed on a side of the transition part 45 away from the base substrate 10; and a planarization layer PLN2 disposed on a side of the passivation layer PVX2 away from the base substrate 10. The transition part 45 is electrically connected to the drain 53 through a via hole penetrating the passivation layer PVX1 and the planarization layer PLN1. The anode 43 is electrically connected to the transition part 45 through a via hole penetrating the passivation layer PVX2 and the planarization layer PLN2. In this way, a transistor of the pixel driver circuit may be electrically connected to the anode 43.

The first substrate 1 may further include a pixel defining layer PDL disposed on a side of the anode 43 away from the base substrate 10. The pixel defining layer PDL may include an opening 441 located in the sub-pixel. The opening 441 exposes a part of the anode 43. A part of the light-emitting layer 42 is filled in the opening 441 to be in contact with the exposed part of the anode 43. The cathode 41 is located on a side of the light-emitting layer 42 away from the base substrate 10.

In the exemplary embodiments shown in the figures, for ease of description, the layer where the gate 51 is located may be referred to as a first conductive layer, the layer where the source 52 and the drain 53 are located may be referred to as a second conductive layer, and the layer where the transition part 45 is located may be referred to as a third conductive layer.

For example, the first electrode pad Cst1 may be located in the first conductive layer, and the second electrode pad Cst2 may be located between the first conductive layer and the second conductive layer. For ease of description, the layer where the second electrode pad Cst2 is located may be referred to as a fourth conductive layer.

For example, the first conductive layer and the fourth conductive layer may be conductive layers made of a material of the gate, and the second conductive layer and the third conductive layer may be conductive layers made of a material of the source and the drain.

For example, the material of the gate may include a metal material, such as Mo, Al, Cu, and alloys thereof. The source and drain materials may include a metal material, such as Mo, Al, Cu, and alloys thereof. The anode may include a metallic conductive material, such as magnesium, aluminum, lithium, and alloys thereof. The cathode may include a transparent conductive material, such as indium tin oxide (ITO) and indium zinc oxide (IZO).

Figure 5:
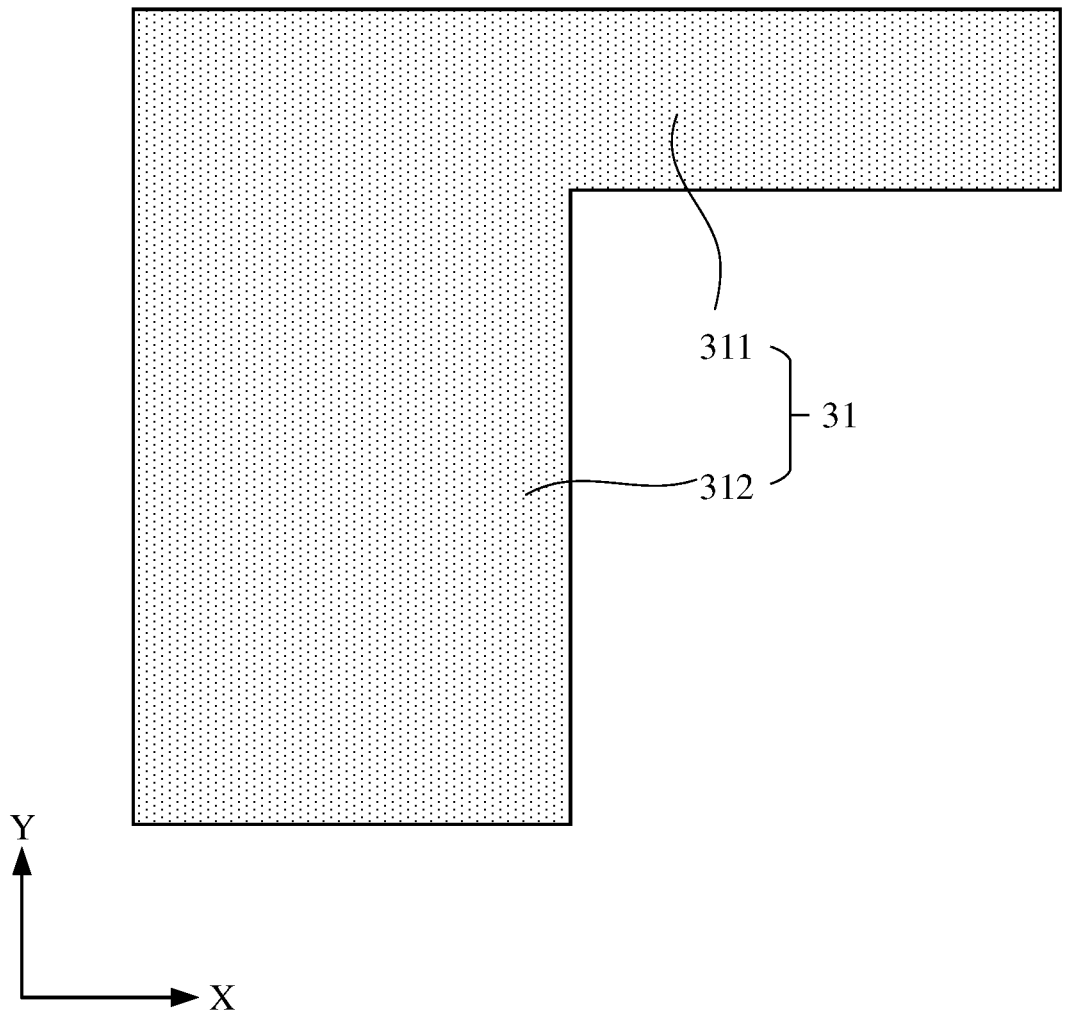
FIG. 5 to FIG. 12 respectively show partial enlarged plan views of a part I of the display substrate in FIG. 3 according to some exemplary embodiments of the present disclosure, where FIG. 5 schematically shows a first conductive layer at the part I, FIG. 6 schematically shows a second conductive layer at the part I, FIG. 7 schematically shows a combination of the first conductive layer and the second conductive layer at the part I, FIG. 8 schematically shows a third conductive layer at the part I, FIG. 9 schematically shows a combination of the first conductive layer, the second conductive layer and the third conductive layer at the part I, FIG. 10 schematically shows a conductive layer arranged in a same layer as an anode at the part I, FIG. 11 schematically shows a combination of the first conductive layer, the second conductive layer, the third conductive layer, and the conductive layer arranged in the same layer as the anode at the part I, and FIG. 12 schematically shows a via hole in a pixel defining layer at the part I.
Figure 6:
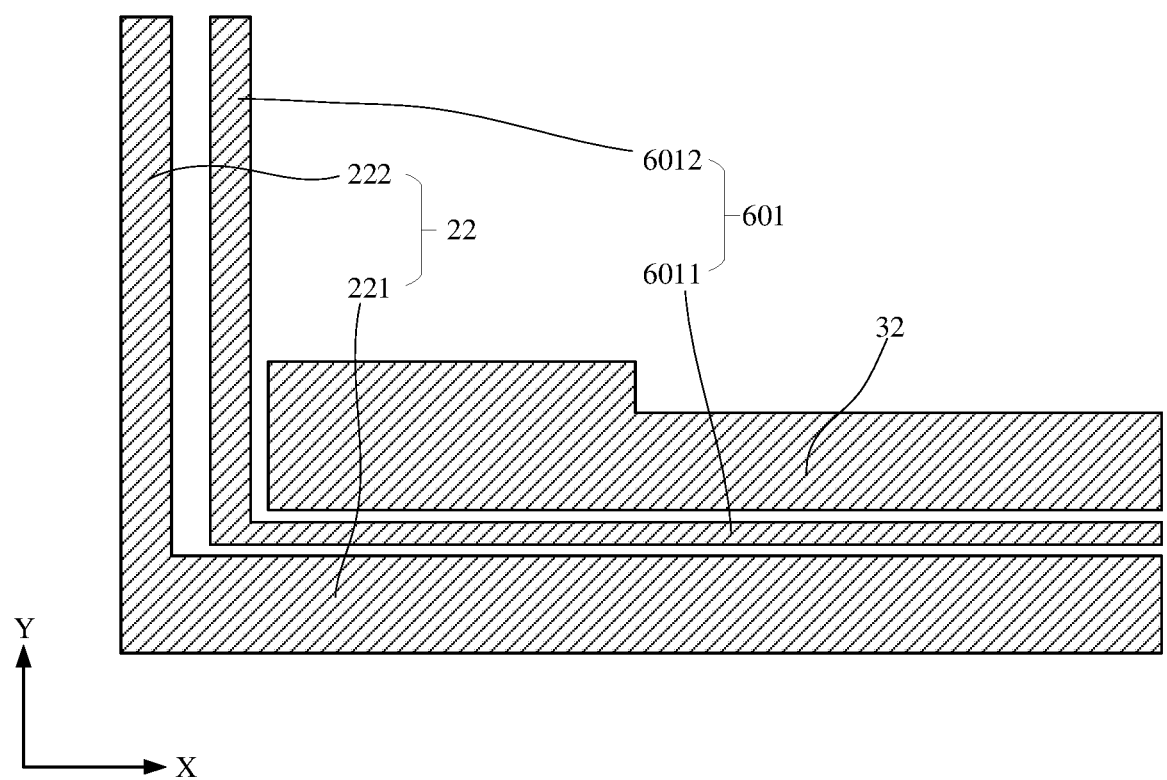
Figure 7:
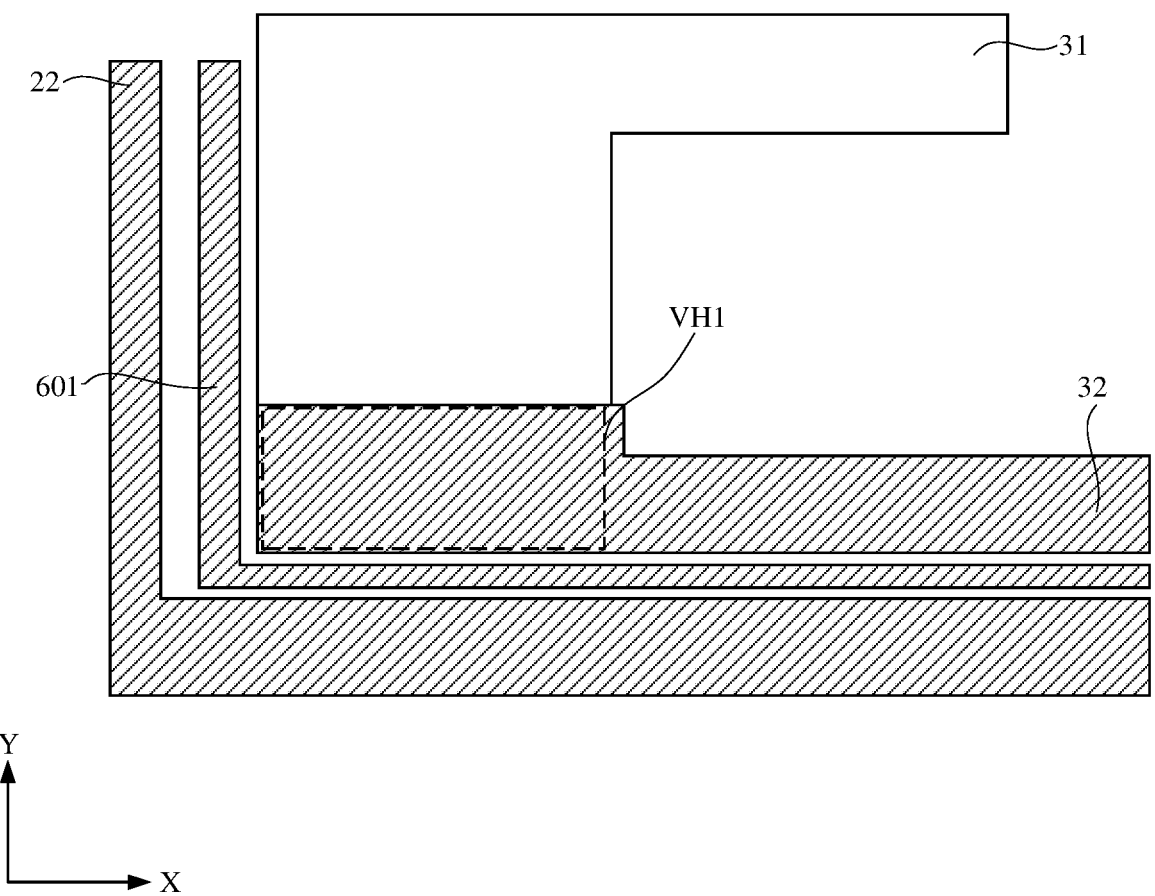
Figure 8:
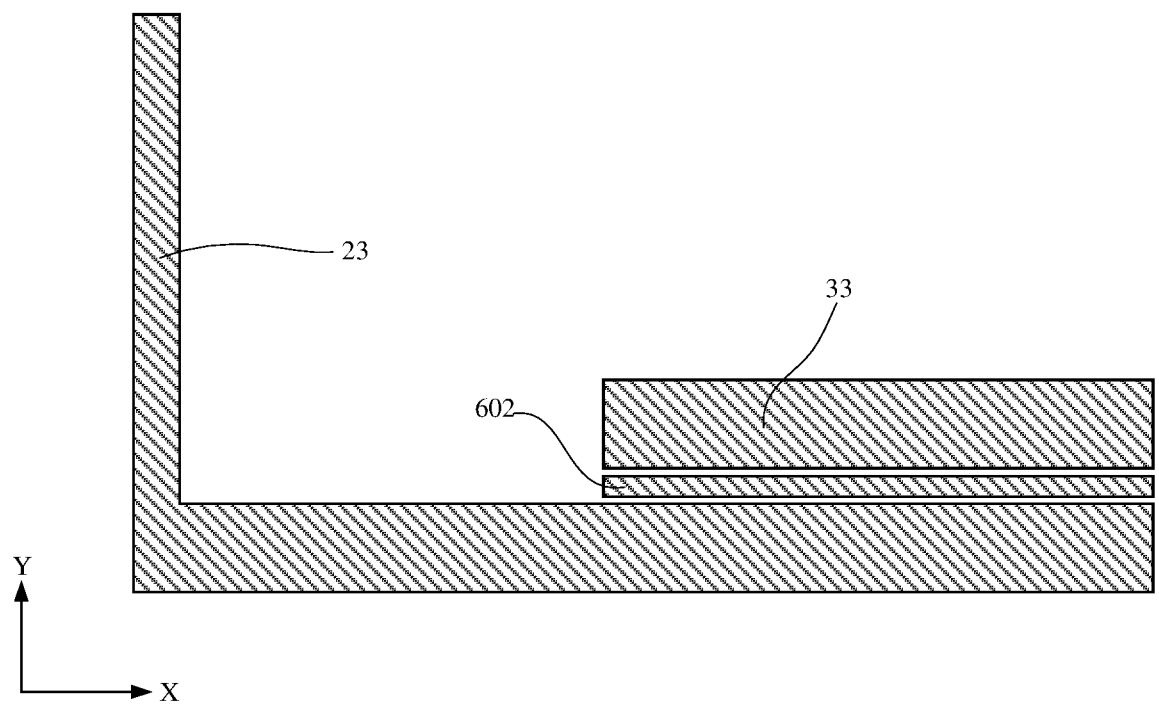
Figure 9:
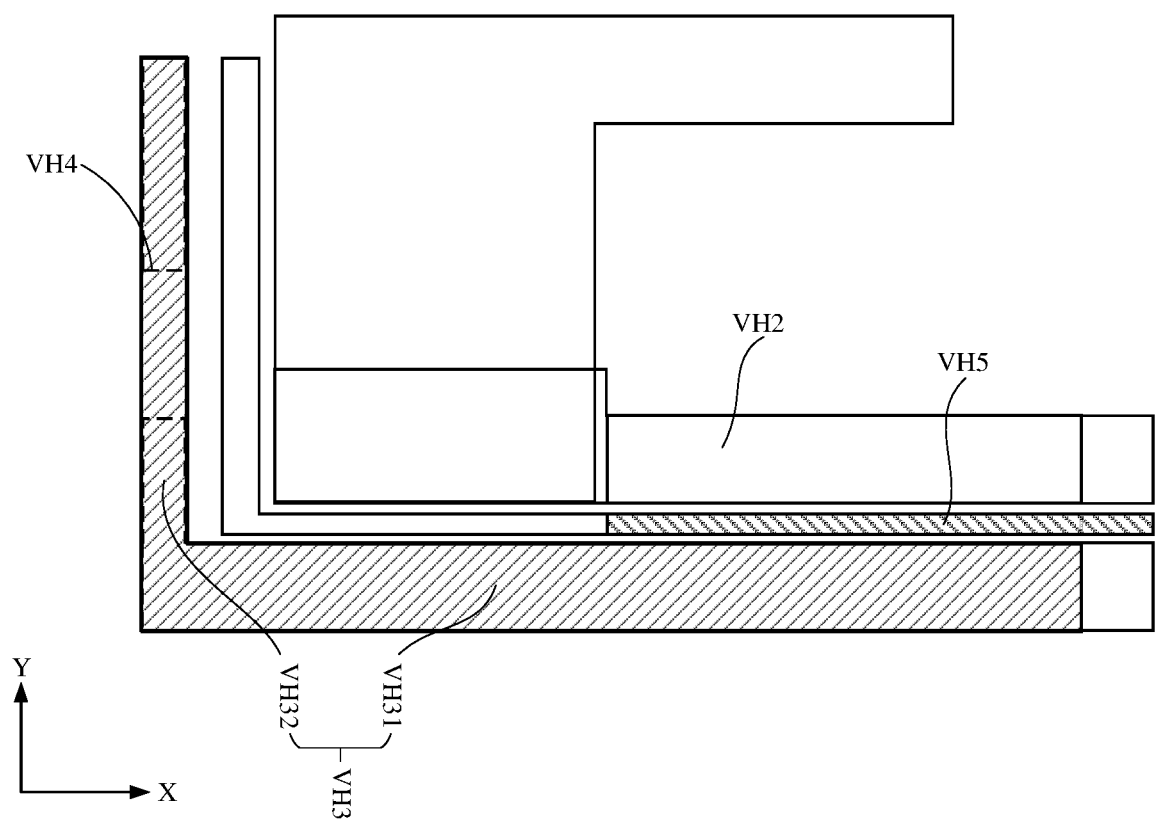
Figure 10:
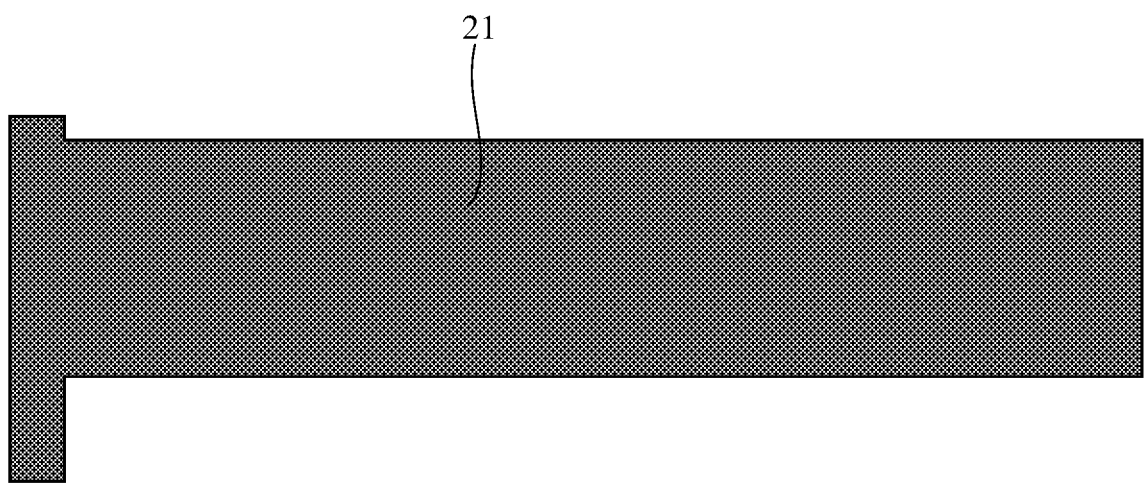
Figure 11:
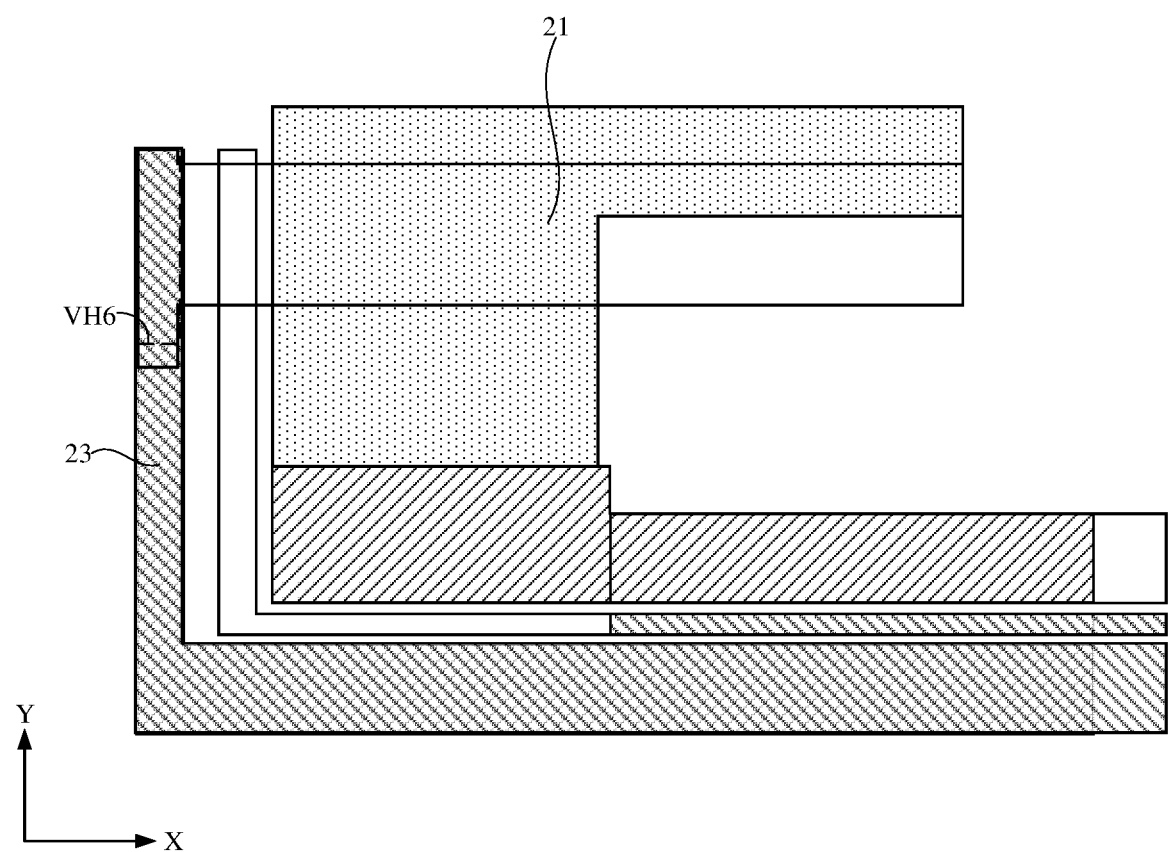
Figure 12:
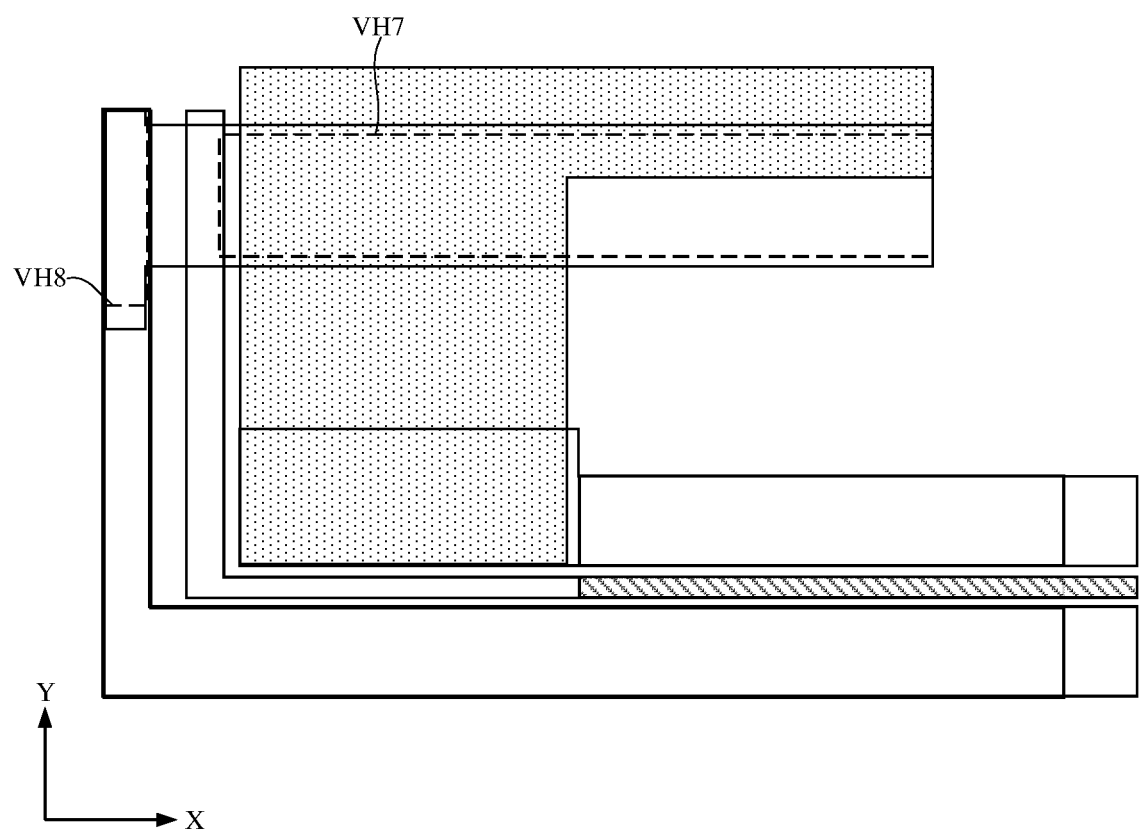

FIG. 5 to FIG. 12 respectively show partial enlarged plan views of a part I of the display substrate in FIG. 3 according to some exemplary embodiments of the present disclosure, where FIG. 5 schematically shows a first conductive layer at the part I, FIG. 6 schematically shows a second conductive layer at the part I, FIG. 7 schematically shows a combination of the first conductive layer and the second conductive layer at the part I, FIG. 8 schematically shows a third conductive layer at the part I, FIG. 9 schematically shows a combination of the first conductive layer, the second conductive layer and the third conductive layer at the part I, FIG. 10 schematically shows a conductive layer arranged in a same layer as an anode at the part I, FIG. 11 schematically shows a combination of the first conductive layer, the second conductive layer, the third conductive layer, and the conductive layer arranged in the same layer as the anode at the part I, and FIG. 12 schematically shows a via hole in a pixel defining layer at the part I.

In an embodiment of the present disclosure, the cathode line 20 includes a plurality of parts respectively located in a plurality of conductive layers. For ease of description, the plurality of parts are respectively referred to as a first cathode sub-line 21, a second cathode sub-line 21, and a third cathode sub-line 23. For example, the first cathode sub-line 21 and the anode 43 may be located in the same layer, the second cathode sub-line 22 may be located in the second conductive layer, and the third cathode sub-line 23 may be located in the third conductive layer. In an embodiment of the present disclosure, the cathode line 20 includes a plurality of cathode sub-lines disposed in different layers, and at least some of the plurality of cathode sub-lines disposed in different layers are electrically connected through via hole(s). In this way, the plurality of cathode sub-lines arranged in different layers are connected in parallel to transmit the cathode signal, which is beneficial to reduce the resistance of the cathode line 20, thereby reducing a drop magnitude of the cathode voltage at the position far away from the signal source (for example, an external driver circuit such as a COF).

In an embodiment of the present disclosure, the display substrate may further include the anode line 30 and the initialization signal line 60 disposed on the base substrate 10. For example, the cathode line 20 may be a line providing a VSS voltage signal, the anode line 30 may be a line providing a VDD voltage signal, and the initialization signal line 60 may be a line providing an initialization voltage signal (i.e., Vint). For example, the cathode line 20 is electrically connected to the cathode 41, and the anode line 30 is electrically connected to the anode 43. It will be noted that "the anode line 30 is electrically connected to the anode 43" here may mean that the anode line 30 is electrically connected to the anode 43 through an electronic component such as a thin film transistor in the pixel driver circuit.

For example, the anode line 30 includes a plurality of parts respectively located in a plurality of conductive layers. For ease of description, the plurality of parts are referred to as a first anode sub-line 31, a second anode sub-line 32, and a third anode sub-line 33, respectively. For example, the first cathode sub-line 31 may be located in the first conductive layer, the second anode sub-line 32 may be located in the second conductive layer, and the third anode sub-line 33 may be located in the third conductive layer. In an embodiment of the present disclosure, the anode line 30 includes a plurality of anode sub-lines disposed in different layers, and at least some of the plurality of anode sub-lines disposed in different layers are electrically connected through via hole (s). In this way, the plurality of anode sub-lines disposed in different layers are connected in parallel to transmit the anode signal, which is beneficial to reduce the resistance of the anode line 30, thereby improving the display uniformity of the display substrate.

For example, the initialization signal line 60 includes a plurality of parts respectively located in a plurality of conductive layers. For ease of description, the plurality of parts are respectively referred to as a first initialization signal sub-line 601, and a second initialization signal sub-line 602. For example, the first initialization signal sub-line 601 may be located in the second conductive layer, and the second initialization signal sub-line 602 may be located in the third conductive layer. In an embodiment of the present disclosure, the initialization signal line 60 includes a plurality of initialization signal sub-lines disposed in different layers, and the plurality of initialization signal sub-lines disposed in different layers are electrically connected through via hole(s). In this way, the plurality of initialization signal sub-lines disposed in different layers are connected in parallel to transmit the initialization voltage signal, which is beneficial to reduce the resistance of the initialization signal line 60, thereby improving the display uniformity of the display substrate.

Referring to FIG. 4, FIG. 5 and FIG. 6, the first anode sub-line 31 is located in the first conductive layer, and may include a first part 311 and a second part 312. The first part 311 of the first anode sub-line extends in the first direction X, and the second part 312 of the first anode sub-line extends in the second direction Y.

Referring to FIG. 4 to FIG. 7, the second anode sub-line 32 is located in the second conductive layer. An insulating layer, such as the insulating layers GI2 and IDL shown in FIG. 4, is disposed between the first conductive layer and the second conductive layer. The insulating layer has a fifth via hole VH1, and an orthographic projection of the fifth via hole VH1 on the base substrate 10 at least partially overlaps with an orthographic projection of the second part 312 of the first anode sub-line on the base substrate 10. In this way, the second anode sub-line 32 may be electrically connected to the second part 312 of the first anode sub-line through the fifth via hole VH1.

For example, the second anode sub-line 32 may have a plurality of different widths. A width of the second anode sub-line 32 at a position corresponding to the fifth via hole VH1 is greater than a width of the second anode sub-line 32 at other positions, such that an area of a contact part between the second anode sub-line 32 and a second part 312 of the first anode sub-line 32 may be increased, which is beneficial to reduce a contact resistance.

Referring to FIG. 6 and FIG. 7, the second cathode sub-line 22 is located in the second conductive layer. The second cathode sub-line 22 may include a first part 221 and a second part 222. For example, the first part 221 may extend substantially in the first direction X, and the second part 222 may extend substantially in the second direction Y.

The first initialization signal sub-line 601 is also located in the second conductive layer. The first initialization signal sub-line 601 may include a first part 6011 and a second part 6012. For example, the first part 6011 may extend substantially in the first direction X, and the second part 6012 may extend substantially in the second direction Y.

Referring to FIG. 4 to FIG. 9, the third anode sub-line 33 is located in the third conductive layer. An insulating layer, such as the insulating layers PVX1 and PLN1 shown in FIG. 4, is disposed between the second conductive layer and the third conductive layer. The insulating layer has a sixth via hole VH2, and an orthographic projection of the sixth via hole VH2 on the base substrate 10 at least partially overlaps an orthographic projection of the second anode sub-line 32 on the base substrate 10. In this way, the third anode sub-line 33 may be electrically connected to the second anode sub-line 32 through the sixth via hole VH2.

The third cathode sub-line 23 is located in the third conductive layer. An insulating layer, such as the insulating layers PVX1 and PLN1 shown in FIG. 4, is disposed between the second conductive layer and the third conductive layer. The insulating layer includes a third via hole VH3 and a fourth via hole VH4, and each of the third via hole VH3 and the fourth via hole VH4 exposes at least a part of the second cathode sub-line 22. The third cathode sub-line 23 is electrically connected to the second cathode sub-line 22 through the third via hole VH3 and the fourth via hole VH4, respectively.

For example, an extending direction of the fourth via hole VH4 is substantially the same as a direction of the second cathode sub-line 22, and the fourth via hole VH4 may expose a part of the second cathode sub-line occupying more than 50% of a perimeter of the second cathode sub-line. Most part of the third cathode sub-line 23 (e.g., a part occupying more than 50% of a perimeter of the third cathode sub-line 23) and most part of the second cathode sub-line 22 (e.g., a part occupying more than 50% of the perimeter of the second cathode sub-line 22) are electrically connected through the fourth via VH4. In this way, in the cathode line 20, a parallel connection of the two cathode sub-lines that are respectively located in the second conductive layer and the third conductive layer may be realized, which is beneficial to reduce the resistance of the cathode line 20.

For example, the third via hole VH3 includes a first part VH31 and a second part VH32, where the first part VH31 extends in the first direction X and the second part VH32 extends in the second direction Y. The first direction X and the second direction Y cross, for example, the first direction X and the second direction Y are perpendicular to each other.

The second initialization signal sub-line 602 is also located in the third conductive layer. The insulating layers PVX1 and PLN1 further include a seventh via hole VH5, and the seventh via hole VH5 exposes a part of the first initialization signal sub-line 601. The second initialization signal sub-line 602 is electrically connected to the first initialization signal sub-line 601 through the seventh via hole VH5.

In the embodiments of the present disclosure, the cathode line, the anode line, and the initialization signal line are respectively led out to the third conductive layer through the third cathode sub-line 23, the third anode sub-line 33, and the second initialization signal sub-line 602 that are located in the third conductive layer. An external driver circuit such as a COF may be disposed in the same layer as the third conductive layer. In such a lead-out manner, it is beneficial for the external driver circuit to supply signals to the respective lines.

For example, the seventh via hole VH5 and the sixth via hole VH2 extend in parallel in the first direction X, and the seventh via hole VH5 and the sixth via hole VH2 are spaced apart in the second direction Y. An orthographic projection of the fifth via hole VH1 on the base substrate 10 and an orthographic projection of the sixth via hole VH2 on the base substrate 10 may be substantially arranged in a same row along the first direction X and spaced apart by a certain distance.

For example, an orthographic projection of the initialization signal line 60 on the base substrate 10 is between an orthographic projection of the second cathode sub-line 22 on the base substrate 10 and an orthographic projection of the anode line 30 on the base substrate 10.

Referring to FIG. 4 to FIG. 11, the first cathode sub-line 21 and the anode 43 are arranged in the same layer. Referring to FIG. 3, the first cathode sub-line 21 may extend in the first direction X to electrically connect two parts of the second cathode sub-line 22 that are located on two sides of the display substrate, so as to form the cathode line 20 surrounding the display area AA.

For example, an insulating layer, such as the insulating layers PVX2 and PLN2 shown in FIG. 4, is disposed between the third conductive layer and the layer where the anode 43 is located. The insulating layer includes an eighth via hole VH6. For example, the insulating layer may include two eighth via holes VH6, and the two eighth via holes VH6 are respectively located on two sides of the display area AA, such that each of the two eighth via holes exposes at least a part of the third cathode sub-line 23 located on two sides of the display area AA. The first cathode sub-line 21 is electrically connected to the third cathode sub-line 23 through the two eighth via holes VH6, respectively.

Referring to FIG. 4 to FIG. 12, the pixel defining layer PDL may include first via holes VH7 and VH8, and each of the first via holes VH7 and VH8 exposes at least a part of the first cathode sub-line 21. The cathode 41 may be electrically connected to the first cathode sub-line 21 through the first via holes VH7 and VH8, respectively. In this way, an electrical connection between the cathode 41 and the cathode line 20 may be realized.

For example, the first via hole VH7 extends in the first direction X. The pixel defining layer PDL may include two second via holes VH8, and the two second via holes VH8 are respectively located on two sides of the display area AA, so that each of the two second via holes VH8 may expose at least a part of the first cathode sub-line 21 located on two sides of the display area AA. In other words, the two second via holes VH8 are respectively located on two sides of the first via hole VH7. An extending direction of the second via hole VH8 is substantially the same as a direction of the first cathode sub-line 21 or a direction of the second cathode sub-line 22, and the second via hole VH8 exposes a part of the first cathode sub-line 21 occupying more than 50% of a perimeter of the first cathode sub-line 21. In this way, an area of the contact between the first cathode line 21 and the cathode 41 may be increased, which is beneficial to reduce a contact resistance.

For example, an orthographic projection of the second via hole VH8 on the base substrate 10 at least partially overlaps with an orthographic projection of the eighth via hole VH6 on the base substrate 10.

For example, an orthographic projection of the first part 311 of the first anode sub-line on the base substrate 10 at least partially overlaps with an orthographic projection of the first cathode sub-line 21 on the base substrate 10.

For example, an orthographic projection of the first part 311 of the first anode sub-line on the base substrate 10 at least partially overlaps with an orthographic projection of the first via hole VH7 on the base substrate 10.

For example, a ratio of a size of a part of the first via hole VH7 overlapping with the second part 312 of the first anode sub-line in the first direction X to a size of the second part 312 of the first anode sub-line in the first direction X is in a range of 0.8 to 1.2. For example, the size of the part of the first via hole VH7 overlapping with the second part 312 of the first anode sub-line in the first direction X is substantially equal to the size of the second part 312 of the first anode sub-line in the first direction X.

For example, a ratio of a size of a part of the first via hole VH7 overlapping with the first part 311 of the first anode sub-line in the first direction X to a size of the first part 311 of the first anode sub-line in the first direction X is in a range of 0.8 to 1.2. For example, the size of the part of the first via hole VH7 overlapping with the first part 311 of the first anode sub-line in the first direction X is substantially equal to the size of the first part 311 of the first anode sub-line in the first direction X.

For example, a ratio of a size of a part of the first via hole VH7 overlapping with the first part 311 of the first anode sub-line in the second direction Y to a size of the first part 311 of the first anode sub-line in the second direction Y is in a range of 0.4 to 0.8. For example, the size of the part of the first via hole VH7 overlapping with the first part 311 of the first anode sub-line in the second direction Y is approximately half of the size of the first part 311 of the first anode sub-line in the second direction Y.

For example, a ratio of a size of the second via hole VH8 in the second direction Y to a size of the first via hole VH7 in the second direction Y is in a range of 1.1 to 10. That is, the size of the second via hole VH8 in the second direction Y is larger than the size of the first via hole VH7 in the second direction Y.

Referring back to FIG. 1 and FIG. 3, a display apparatus according to the embodiments of the present disclosure may include the display substrate described above. For example, the display apparatus includes a display area AA and a peripheral area NA, and a film layer structure in the display area AA and the peripheral area NA may refer to the description of the embodiments described above, which will not be repeated here.

The display apparatus may include any apparatus or product having a display function. For example, the display apparatus may be a smartphone, a mobile phone, an e-book reader, a desktop computer, a laptop PC, a netbook PC, a personal digital assistant (PDA), a portable multimedia player (PMP), a digital audio player, a mobile medical device, a camera, a wearable device (such as a head-mounted device, an electronic apparel, an electronic wristband, an electronic necklace, an electronic accessory, an electronic tattoo, or a smart watch), a television, etc.

It will be understood that the display apparatus according to the embodiments of the present disclosure has all the features and advantages of the display substrate described above (e.g., the first substrate), and for detail, the above description may be referred to.

Some embodiments of the general technical concept of the present disclosure have been illustrated and described. However, those of ordinary skill in the art will appreciate that these embodiments may be changed without departing from the principles and spirit of the general technical concept. The scope of the present disclosure is defined by the claims and their equivalents.

What is claimed is:

1. A display substrate, comprising:
a base substrate comprising a display area and a peripheral area located on at least a first side of the display area;
a plurality of pixel units arranged in an array along a first direction and a second direction in the display area of the base substrate, wherein the pixel unit comprises a pixel driver circuit and a light-emitting device electrically connected to the pixel driver circuit, and the light-emitting device comprises a cathode, an anode, and a light-emitting layer disposed between the cathode and the anode;
an anode line located in the peripheral area and configured to supply a power supply voltage; and
a cathode line located in the peripheral area and electrically connected to the cathode,
wherein the cathode line substantially surrounds the display area, and the cathode is electrically connected to the cathode line at a plurality of positions; and
wherein the cathode line comprises a first cathode sub-line located in a same layer as the anode, and an orthographic projection of the first cathode sub-line on the base substrate partially overlaps with an orthographic projection of the anode line on the base substrate;
wherein the pixel driver circuit comprises at least one thin film transistor and at least one capacitor that are disposed on the base substrate, the thin film transistor comprising an active layer, a gate, a source, and a drain;
the display substrate comprises: a first conductive layer disposed on a side of the active layer away from the base substrate, the gate being located in the first conductive layer; a second conductive layer disposed on a side of the first conductive layer away from the base substrate, the source and the drain being located in the second conductive layer; a third conductive layer disposed on a side of the second conductive layer away from the base substrate, the third conductive layer being located between the second conductive layer and a layer where the anode is located; and
wherein the anode line comprises a first anode sub-line located in the first conductive layer, the orthographic projection of the first cathode sub-line on the base substrate partially overlaps with an orthographic projection of the first anode sub-line on the base substrate;
the first cathode sub-line extends in the first direction, and the overlap between the orthographic projection of the first cathode sub-line on the base substrate and the orthographic projection of the first anode sub-line on the base substrate extends in the first direction.

2. The display substrate according to claim 1, wherein the display substrate further comprises a pixel defining layer on the base substrate, the pixel defining layer being between a layer where the anode is located and a layer where the cathode is located;
the pixel defining layer comprises a first via hole and a second via hole, each of the first via hole and the second via hole exposes at least a part of the first cathode sub-line, and the cathode is electrically connected to the first cathode sub-line through the first via hole and the second via hole.

3. The display substrate according to claim 2, wherein the first via hole extends in the first direction, the pixel defining layer comprises at least two second via holes, and the at least two second via holes are respectively located on two sides of the first via hole.

4. The display substrate according to claim 1, wherein the cathode line comprises a second cathode sub-line located in the second conductive layer.

5. The display substrate according to claim 4, wherein the cathode line comprises a third cathode sub-line located in the third conductive layer.

6. The display substrate according to claim 5, wherein the display substrate comprises a first insulating layer disposed between the second conductive layer and the third conductive layer, the first insulating layer comprises a third via hole and a fourth via hole, and each of the third via hole and the fourth via hole exposes at least a part of the second cathode sub-line; and
the third cathode sub-line is electrically connected to the second cathode sub-line through the third via hole and the fourth via hole.

7. The display substrate according to claim 6, wherein an extending direction of the fourth via hole is the same as a direction of the second cathode sub-line, and the fourth via hole is configured to expose a part of the second cathode sub-line occupying more than 50% of a perimeter of the second cathode sub-line; and/or,
an extending direction of the second via hole is the same as the direction of the second cathode sub-line, and the second via hole is configured to expose a part of the first cathode sub-line occupying more than 50% of a perimeter of the first cathode sub-line.

8. The display substrate according to claim 6, wherein the third via hole comprises a first part and a second part, wherein the first part extends in the first direction and the second part extends in the second direction, the first direction and the second direction crossing.

9. The display substrate according to claim 6, wherein an orthographic projection of the second via hole on the base substrate at least partially overlaps with an orthographic projection of the fourth via hole on the base substrate.

10. The display substrate according to claim 6, wherein the display substrate comprises a second insulating layer disposed between the third conductive layer and the layer where the anode is located, wherein the second insulating layer comprises an eighth via hole, and the eighth via hole exposes at least a part of the third cathode sub-line;
the first cathode sub-line is electrically connected to the third cathode sub-line through the eighth via hole; and
an orthographic projection of the eighth via hole on the base substrate at least partially overlaps an orthographic projection of the fourth via hole on the base substrate.

11. The display substrate according to claim 1, wherein the anode line further comprises a second anode sub-line located in the second conductive layer, wherein the second anode sub-line is electrically connected to the first anode sub-line through a fifth via hole.

12. The display substrate according to claim 11, wherein the anode line comprises a third anode sub-line located in the third conductive layer, and the third anode sub-line is electrically connected to the second anode sub-line through a sixth via hole.

13. The display substrate according to claim 12, wherein the first anode sub-line comprises a first part and a second part, wherein the first part of the first anode sub-line extends in the first direction, and the second part of the first anode sub-line extends in the second direction; and an orthographic projection of the fifth via hole on the base substrate at least partially overlaps with an orthographic projection of the second part of the first anode sub-line on the base substrate.

14. The display substrate according to claim 13, wherein an orthographic projection of the first part of the first anode sub-line on the base substrate at least partially overlaps with the orthographic projection of the first cathode sub-line on the base substrate.

15. The display substrate according to claim 13, wherein an orthographic projection of the first part of the first anode sub-line on the base substrate at least partially overlaps with an orthographic projection of the first via hole on the base substrate.

16. The display substrate according to claim 11, wherein an orthographic projection of the first anode sub-line on the base substrate partially overlaps with an orthographic projection of the first via hole on the base substrate.

17. The display substrate according to claim 16, wherein a ratio of a size of a part of the first via hole overlapping with the second part of the first anode sub-line in the first direction to a size of the second part of the first anode sub-line in the first direction is in a range of 0.8 to 1.2; and/or,
a ratio of a size of a part of the first via hole overlapping with the first part of the first anode sub-line in the first direction to a size of the first part of the first anode sub-line in the first direction is in a range of 0.8 to 1.2; and/or,
a ratio of a size of the part of the first via hole overlapping with the first part of the first anode sub-line in the second direction to a size of the first part of the first anode sub-line in the second direction is in a range of 0.4 to 0.8; and/or,
a ratio of a size of the second via hole in the second direction to a size of the first via hole in the second direction is in a range of 1.1 to 10.

18. The display substrate according to claim 1, wherein the display substrate further comprises an initialization signal line located in the peripheral area, the initialization signal line being configured to supply an initialization voltage;
the initialization signal line comprises a first initialization signal sub-line and a second initialization signal sub-line, wherein the first initialization signal sub-line is located in the second conductive layer and the second initialization signal sub-line is located in the third conductive layer;
the first initialization signal sub-line is electrically connected to the second initialization signal sub-line through a seventh via hole; and
an orthographic projection of the initialization signal line on the base substrate is between an orthographic projection of the second cathode sub-line on the base substrate and an orthographic projection of the anode line on the base substrate.

19. The display substrate according to claim 18, wherein the seventh via hole and a sixth via hole extend in parallel in the first direction, and the seventh via hole and the sixth via hole are spaced apart in the second direction.

20. A display apparatus comprising the display substrate according to claim 1.

* * * * *